United States Patent
Bettencourt (10) Patent No.: US 12,028,059 B2
(45) Date of Patent: Jul. 2, 2024

(54) COMMON GATE INPUT CIRCUIT FOR III/V D-MODE BUFFERED FET LOGIC (BFL)

(71) Applicant: Raytheon Company, Tewksbury, MA (US)

(72) Inventor: John P. Bettencourt, Boxford, MA (US)

(73) Assignee: Raytheon Company, Tewksbury, MA (US)

( * ) Notice: Subject to any disclaimer, the term of this patent is extended or adjusted under 35 U.S.C. 154(b) by 173 days.

(21) Appl. No.: 17/655,356

(22) Filed: Mar. 17, 2022

(65) Prior Publication Data

US 2023/0299768 A1    Sep. 21, 2023

(51) Int. Cl.
  *H03K 17/687*    (2006.01)
  *H03K 19/0185*    (2006.01)

(52) U.S. Cl.
  CPC . *H03K 17/6871* (2013.01); *H03K 19/018507* (2013.01)

(58) Field of Classification Search
  CPC .................. H03K 17/6871; H03K 19/018535
  See application file for complete search history.

(56) References Cited

U.S. PATENT DOCUMENTS

| | | | |
|---|---|---|---|
| 4,680,484 A | 7/1987 | Saunders | |
| 4,701,643 A | 10/1987 | Laude et al. | |
| 4,712,023 A | 12/1987 | Otsuki et al. | |
| 4,760,288 A | 7/1988 | Peczalski | |
| 4,798,978 A | 1/1989 | Lee et al. | |
| 4,931,669 A * | 6/1990 | Higashisaka .... | H03K 19/01721 326/82 |

(Continued)

FOREIGN PATENT DOCUMENTS

| | | |
|---|---|---|
| JP | H0193212 | 4/1989 |
| TW | 201108387 | 3/2011 |

(Continued)

OTHER PUBLICATIONS

"International Application Serial No. PCT US2023 010861, International Search Report dated Jun. 1, 2023", 3 pgs.

(Continued)

*Primary Examiner* — Metasebia T Retebo
(74) *Attorney, Agent, or Firm* — Schwegman Lundberg & Woessner, P.A.

(57) ABSTRACT

A common gate input circuit for III/V D-mode Buffered FET Logic (BFL) maximizes the dynamic range to drive a level shift section to set the proper voltage levels to switch the BFL and allows for decoupling of the switch point from the dynamic range. A common gate switching section includes a D-mode FET (FET1) configured as a load and a D-mode FET (FET2) configured as a common gate connected in series between high and low supplies Vdd and Vee1 (typically ground potential). The gate electrode of FET2 is coupled to Vee1 and the source electrode of FET2 is driven by the external digital signals. This eliminates the additional supply Vss, thus maximizing the dynamic range of the section to switch between Vdd and Vee1 and decouples the dynamic range from the switch point. An input level shift section may shift the Data In to the source electrode of FET2 to shift the switch point and to present a high input impedance.

18 Claims, 9 Drawing Sheets

(56) References Cited

U.S. PATENT DOCUMENTS

| | | | |
|---|---|---|---|
| 5,286,985 A * | 2/1994 | Taddiken | H01L 27/11898 257/E27.11 |
| 5,705,940 A | 1/1998 | Newman et al. | |
| 8,085,075 B2 | 12/2011 | Huffman et al. | |

FOREIGN PATENT DOCUMENTS

| | | |
|---|---|---|
| TW | 202339433 | 10/2023 |
| WO | 2023177470 | 9/2023 |

OTHER PUBLICATIONS

"International Application Serial No. PCT US2023 010861, Written Opinion dated Jun. 1, 2023", 8 pgs.

Ramella, Chiara, "GaAs-Based Serial-Input-Parallel-Output Interfaces for Microwave Core-Chips", Electronics 10, 3029, (2021), 16 pgs.

Tsividis, Yannis, "A Process-Insensitive High-Performance NMOS Operational Amplifier", IEEE Journal of Solid-State Circuits, vol. SC-15, No. 6, (Dec. 1980), 921-928.

"Taiwanese Application Serial No. 111149496, Office Action dated Sep. 6, 2023", W English Translation, 4 pgs.

"Taiwanese Application Serial No. 111149496, Response filed Oct. 23, 2023 to Office Action dated Sep. 6, 2023", W English Claims, 29 pgs.

"Taiwanese Application Serial No. 111149496, Response Filed Oct. 13, 2023 to Office Action dated Sep. 6, 2023", W English Claims, 52 pgs.

* cited by examiner

COMMON GATE INPUT CIRCUIT FOR III/V D-MODE BUFFERED FET LOGIC (BFL)

BACKGROUND OF THE INVENTION

Field of the Invention

This invention relates to input circuits for interfacing external digital signals, typically CMOS TTL to III/V Integrated Circuits (ICs) having D-Mode Buffered FET logic (BFL).

Description of the Related Art

Figure 1:
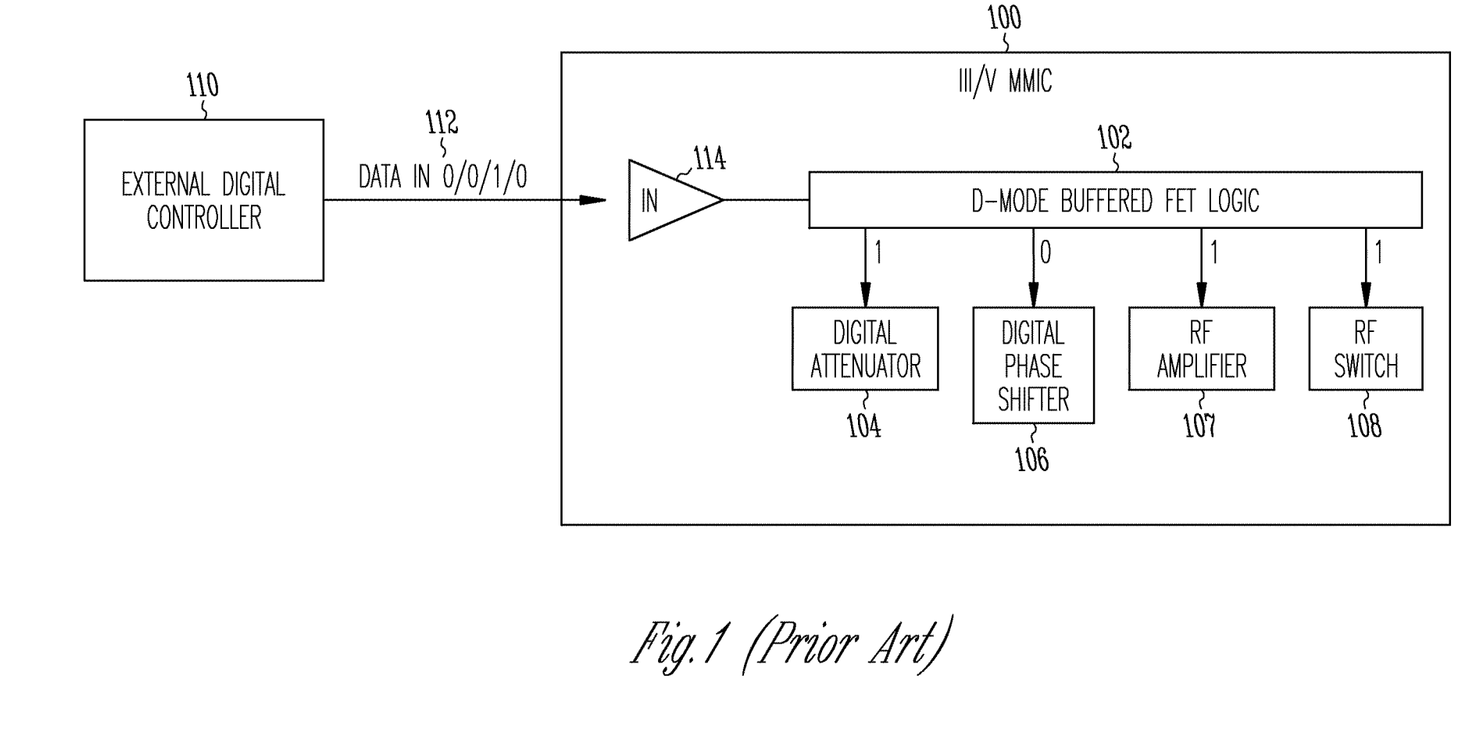
FIG. 1, as described above, is a block diagram of a III/V IC including D-mode BFL and an input circuit to convert external logic signals to voltage levels compatible to drive the III/V D-mode FETs.

Highly integrated Monolithic Microwave Integrated Circuits (MMICs) formed from III/V materials such as Gallium-Arsenide (GaAs), Gallium-Nitride (GaN) and Indium-Phosphide (InP) are often used in phase array systems to perform several functions on a single chip i.e., switching, phase shift control, attenuation control and amplification. As shown in FIG. 1, a MMIC chip 100 includes D-Mode Buffered FET logic (BFL) 102 to provide a digital attenuator 104, a digital phase shifter 106, an RF amplifier 107 and an RF switch 108, for example. An external digital controller 110 provides digital control signals 112 that control the FET logic circuitry. To reduce the amount of external control lines required to perform these functions an input circuit 114 is embedded into the III/V MMIC to perform a "serial input to parallel output" translation. This embedded translation can take a single external data control line input and translate it to many parallel output control signals within the III/V MMIC. External digital control signals are typically at standard CMOS TTL levels e.g., 5V CMOS, TTL, LVTTL, 2.5V and 1.8V. III/V MMICS based on depletion mode (D-mode) FET technology preferably use Buffered FET Logic (BFL) for the embedded digital circuitry. Input circuits are required for other III/V ICs as well.

When converting digital signals from one type of device, here a digital controller to III/V MMIC, signals must be compatible and sufficiently regenerated for the second device to process such signals. Accordingly, input circuit 114 must also provide a CMOS to III/V BFL interface to convert the CMOS voltage levels (e.g., a logic 0 is 0-0.5V and a logic 1 is 2 to 2.5 V for 2.5 TTL) to well-regulated D-Mode III/V voltage levels (e.g., a logic 0 is approximately 0.2 V and a logic 1 is 2.4 V). To maximize regeneration of signals it would be desirable to maximize peak to peak voltage swings (e.g., dynamic range) within the limitations of available power supplies. Input circuit 114 is embedded in the MMIC typically preceding any logic gate function stages. The input circuit includes a switching section to maximize dynamic range for the available power supplies and a level shift function to set the proper voltage levels for the III/V D-mode FETs.

D-mode FETs used in BFL are "normally on" devices, requiring a negative gate-source voltage Vgs to put the transistor into an open circuit or off (non-conducting) state. A typical negative Vgs threshold might be −0.9 V, which is referred to as the "switch point". This negative gate source voltage requirement can limit the amount of dynamic range available for a given supply, directly affecting voltage noise margin of logic input circuits. This limitation in dynamic range is a direct result of a "common source" switching section within core BFL cells. Examples of common source input circuits are described in U.S. Pat. No. 5,705,940 FIG. 10, U.S. Pat. No. 5,286,985 FIG. 1 and Chiara Ramella et. al., "GaAs-Based Serial-Input-Parallel-Output Interfaces for Microwave Core-Chips" Electronics 2021, 10, 3020, pp 1-16.

Figure 2A:
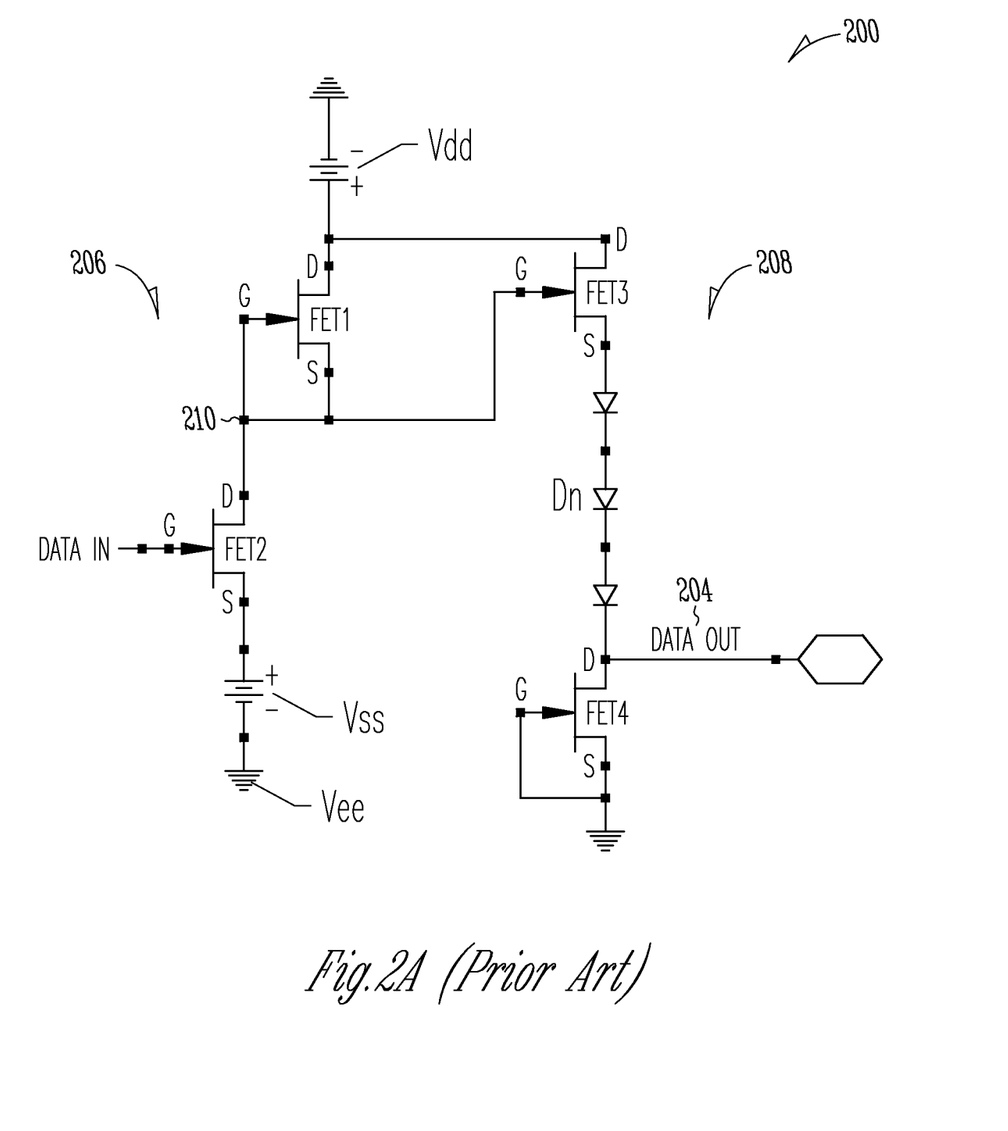
FIGS. 2A-2C, as described above, illustrate an embodiment of an input inverter including a common source switching section and a source follower level shifter and the dynamic ranges of the switched voltages.
Figure 2B:
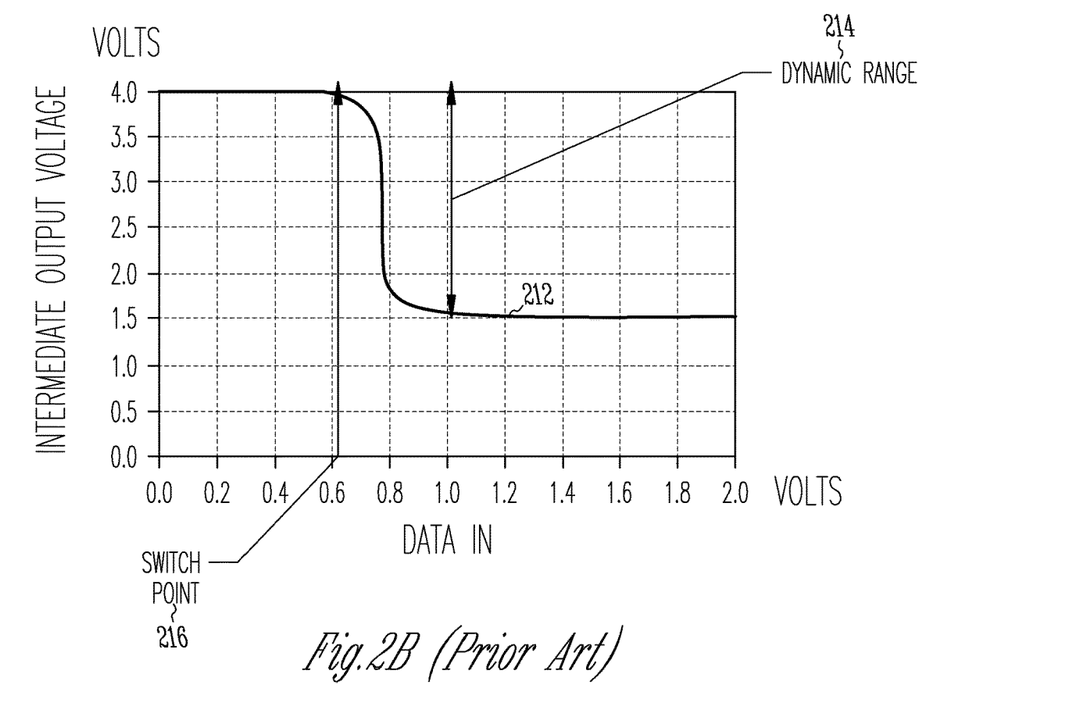
Figure 2C:
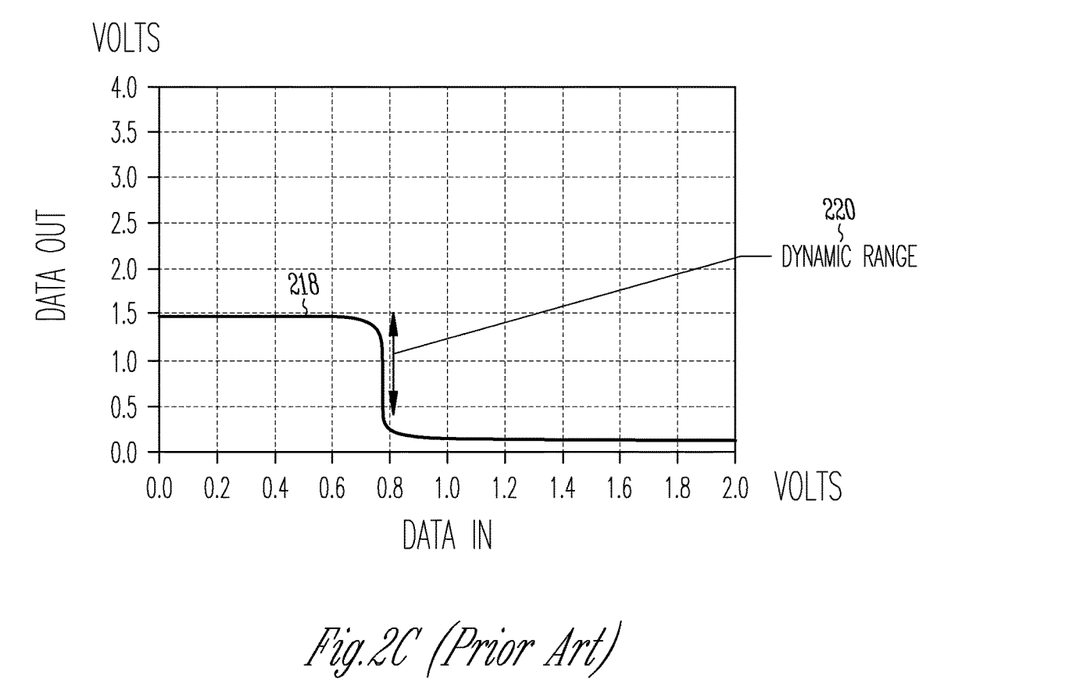

FIGS. 2A-2C illustrate a typical embodiment of a buffered logic FET inverter 200 for interfacing external CMOS digital signals with D-mode III/V BFL. In this example, the Data In 202 has a voltage level of 0-0.5V for logic 0 and 2-2.5 V for logic 1. The Data Out 204 (to switch the D-mode III/V FETs) has a voltage level of approximately 0.2V (ideally 0 V at the ground potential) for logic 0 and 1.5 V for logic 1. Inverter 200 includes a common source switching section 206 that inverts and switches the Data In 202 to provide a dynamic range for the available power supplies and a level shift section 208 that sets the proper voltage levels for Data Out 204.

Common source switching section 206 includes a D-mode FET (FET1) configured as a load and a D-mode FET (FET2) configured as a common source switch connected in series between a high supply voltage Vdd (e.g. 4V) and a low supply voltage Vee (e.g., ground potential). More specifically, the drain electrode of load FET1 is coupled to Vdd and its gate-source connection is coupled to the drain of common source FET2 at an intermediate output 210. Data In 202 is directed to the gate electrode of common source FET2. The gate electrode presents a high input impedance to the external digital controller, thus limiting the amount of current required to drive the input circuit. For this reason, biasing the common source FET2 drain and source electrodes while driving the gate electrode is common practice. An additional supply voltage Vss (e.g., 1.5V) is applied at the source electrode of common source FET2. Vss is typically derived from existing supply voltages with diodes or voltage dividers. Vss is necessary to generate the negative Vgs when Data In is a logic 0 (0 to 0.5 V) to turn FET2 off. For example, if Data In is 0.5 V, the Vgs=−1 V, which is sufficient to turn FET off. When Data In is a logic 1 (2-2.5 V), the Vgs is positive and FET2 remains on.

As shown in FIG. 2B, when Data In is a logic 0, common source FET2 turns off so no current flows through load FET1 causing an intermediate output voltage 212 at intermediate output 210 to be pulled up to Vdd (e.g., 4 V). When Data In is a logic 1, common source FET2 turns on and pulls intermediate output voltage 212 down to Vss (e.g., 1.5V). As shown, a dynamic range 214 of the common source switching section is limited to 2.5 V instead of a maximum of 4V if Vss was not required and the logic state has been inverted.

The switch point 216 is the point determined by the threshold Vgs (the point where FET2 stops conducting current) and the additional supply Vss. In this example, the switch point 216 is 1.5 V (Vss)+Vgs threshold (−0.9 V) which is 0.6 V. Below 0.6 V (the range of Data In logic 0) FET2 is turned off. The switch point 216 is effectively set by the value of Vss. The minimum switch point, hence minimum Vss, is determined by the upper end of the range for the Data In logic 0. In this example, Data In logic 0 is 0 to 0.5 V. The max value for 0 is less than the switch point. If a higher switch point, and higher Vss if required (or desired), this will further reduce the dynamic range 214 for a given high supply Vdd. The coupling of the switch point to the dynamic range may complicate or limit the design to properly switch for different external digital logic such as 5V CMOS, TTL, LVTTL, 2.5V and 1.8V, which have different high voltage supplies and different switching regions.

Referring again to FIG. 2A, level shift section 208 includes a D-mode FET (FET3) configured as a source follower, N series-connected diodes Dn and a D-mode FET (FET4) configured as a current source. The drain electrode of FET3 is coupled to the high supply Vdd. The gate electrode of FET3 is coupled to intermediate output 210 so that a voltage at the source of FET3 follows the intermediate output voltage 212. The N diodes Dn level shift this voltage down by N diode drops (e.g., N*0.6 V) to produce low and high output voltage levels 218 for Data Out 204 at the drain electrode of current source FET4. In an alternate embodiment, the diodes Dn and FET4 could be replaced with a load resistor. Typically, the low output voltage level for an output logic 0 is driven to the low supply (e.g., ground potential). To accomplish this, the diode drop must exceed Vss. In this case, N=3 diodes are used to drive Data Out logic 0 to ground. This necessarily reduces the output voltage level for logic 1 by the same amount. As a result, as shown in FIG. 2C, a dynamic range 220 of inverter 200 is further limited, in this case to 1.5 V. The inverter cannot support a higher voltage level for logic 1 and still provide a low voltage level at ground potential for logic 0.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides an input circuit for III/V D-mode Buffered FET Logic (BFL) that maximizes the dynamic range provided from a common gate switching section to drive an output level shift section to set the proper voltage levels to switch the BFL and allows for decoupling of the switch point from the dynamic range. Increasing the dynamic range in the high-gain common gate switching section reduces the noise impact of level shift sections in degrading noise performance. Decoupling the switch point from the dynamic range allows the switch point to be set to accommodate different voltage ranges for the input logic levels without degrading the dynamic range. Unlike the common switch configurations, the common gate input circuit is non-inverting.

This is accomplished in a III/V IC in which a common gate switching section includes a D-mode FET (FET1) configured as a load and a D-mode FET (FET2) configured as a common gate connected in series between high and low supplies Vdd and Vee1 (typically ground potential). The gate electrode of FET2 is coupled to Vee1 and the source electrode of FET2 is driven by the external digital signals. This eliminates the additional supply Vss, thus maximizing the dynamic range of the section to switch between Vdd and Vee1 and decouples the dynamic range from the switch point.

An input level shift section may shift the Data In voltage levels applied to the source electrode of FET2 to shift the switch point and/or to present a high input impedance. In one embodiment, the input level shift section includes a D-mode FET configured as a source follower, M series-connected diodes and a D-mode FET configured as a current source. The gate electrode of the source follower presents a high input impedance to the digital input signals and the M series-connected diodes shift the switch point. In another embodiment, the source follower is omitted, and the digital input signals are directly coupled to the M series-connected diodes to shift the switch point.

These and other features and advantages of the invention will be apparent to those skilled in the art from the following detailed description of preferred embodiments, taken together with the accompanying drawings, in which:

DETAILED DESCRIPTION OF THE INVENTION

The present invention provides an input circuit for III/V D-mode Buffered FET Logic (BFL) that maximizes the dynamic range provided from a common gate switching section to drive a level shift section to set the proper voltage levels to switch the BFL and decouples the switch point from the dynamic range. Increasing the dynamic range in the high-gain common gate switching section reduces the noise impact of level shift sections in degrading noise performance. Decoupling the switch point from the dynamic range allows the switch point to be set to accommodate different voltage ranges for the input logic levels without degrading the dynamic range. Unlike the common switch configurations, the common gate input circuit is non-inverting.

This is accomplished in a III/V IC in which a common gate switching section includes a D-mode FET (FET1) configured as a load and a D-mode FET (FET2) configured as a common gate connected in series between high and low supplies Vdd and Vee1 (typically ground potential). The gate electrode of FET2 is coupled to Vee1 and the source electrode of FET2 is driven by the external digital signals. This eliminates the additional supply Vss, thus maximizing the dynamic range of the section to switch between Vdd and Vee1 (approximately) and allows for decoupling of the dynamic range from the switch point. An input level shift section may shift the Data In to the source electrode of FET2 to shift the switch point and to present a high input impedance.

Figure 3A:
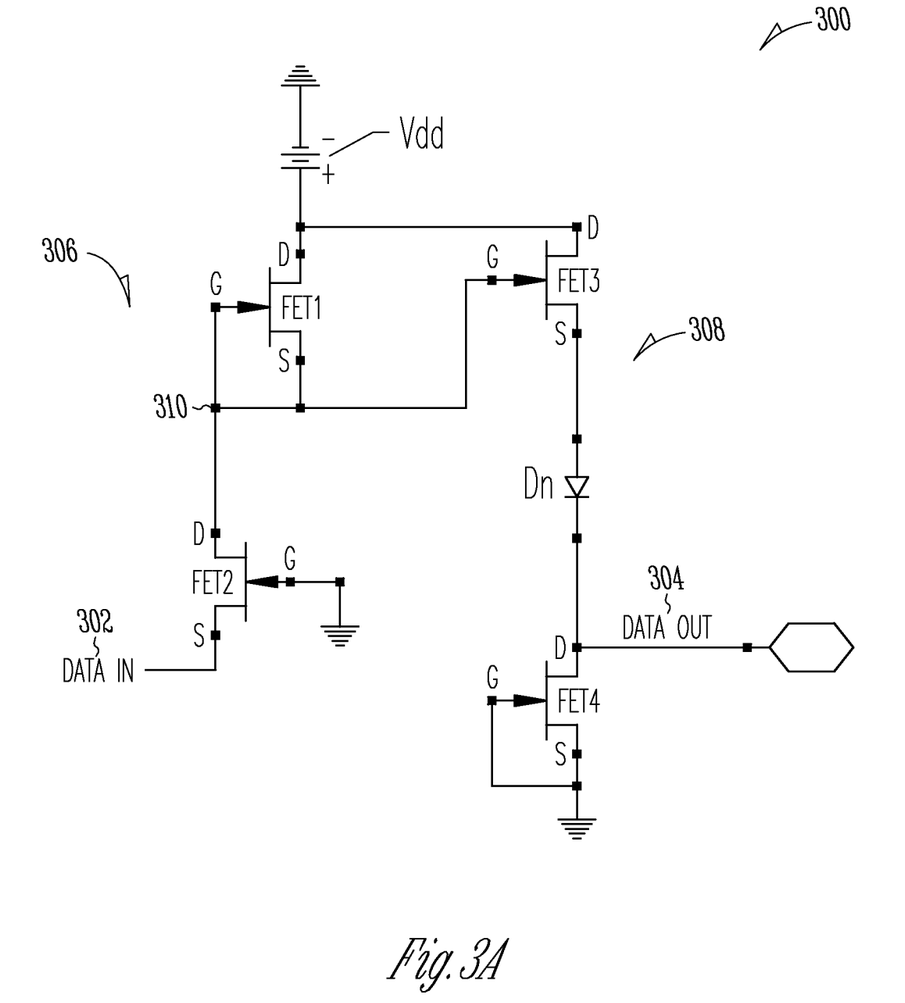
FIGS. 3A-3C illustrate a first embodiment of an input inverter including a common gate switching section whose source electrode is directly coupled to the input logic signals and a source follower level shifter and the dynamic ranges of the switched voltages.
Figure 3B:
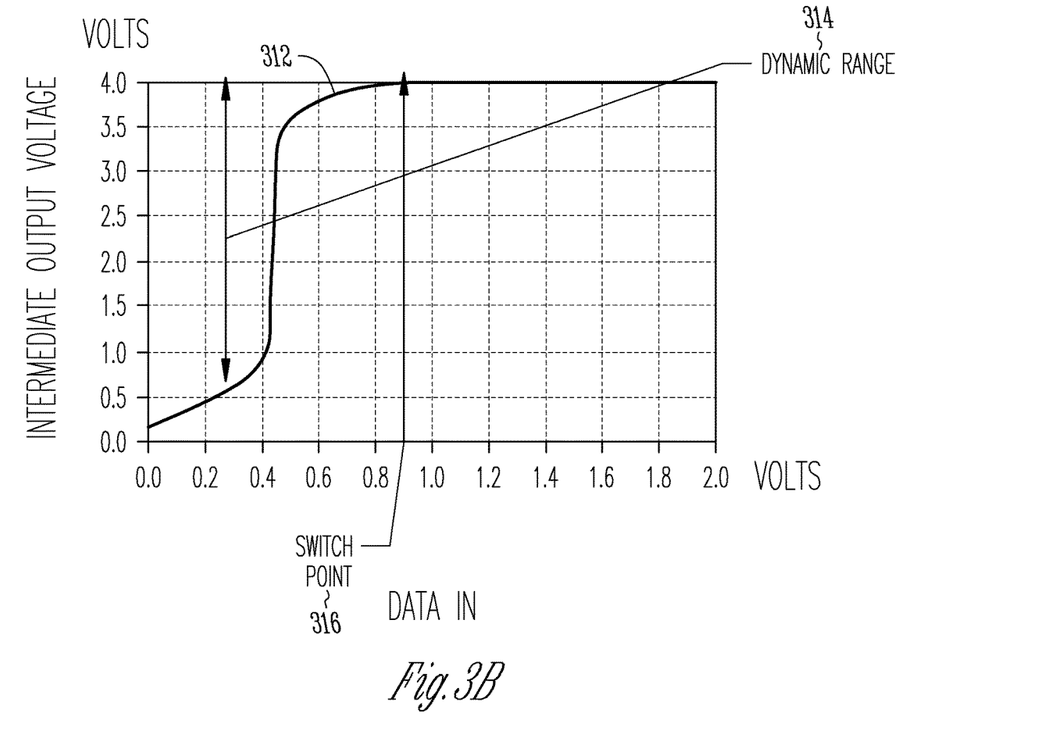
Figure 3C:
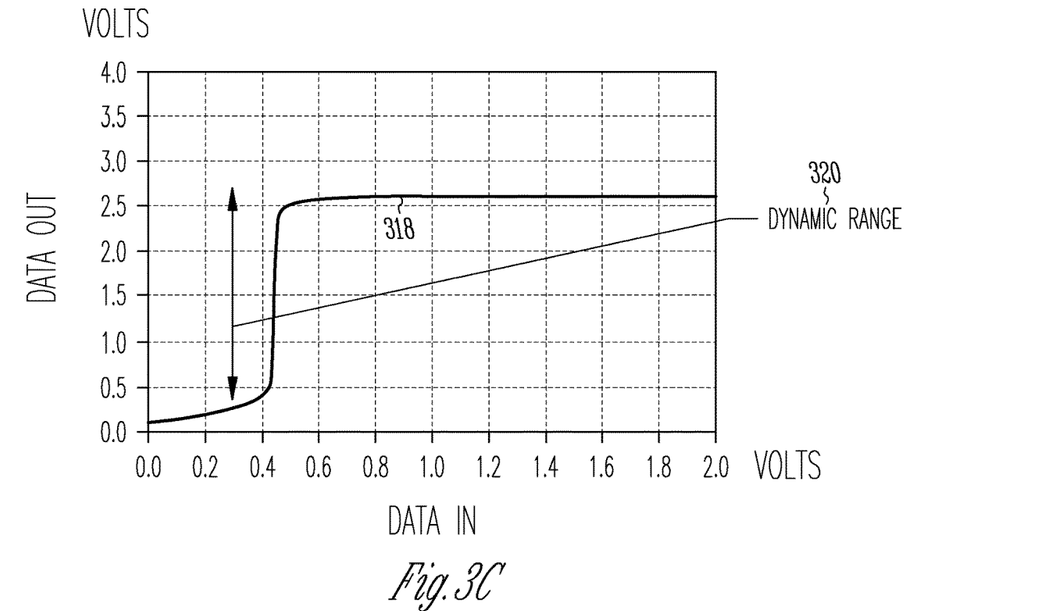

Referring now to FIGS. 3A-3C, in an embodiment an input circuit 300 interfaces external digital signals e.g., standard CMOS levels e.g., 5V CMOS, TTL, LVTTL, 2.5V and 1.8V, with D-mode III/V BFL. In this example, the Data In 302 has a voltage level of 0-0.5V for logic 0 and 2-2.5 V for logic 1. The Data Out 304 (to switch the D-mode III/V FETs) has a voltage level of approximately 0.2V (ideally 0 V at the ground potential) for logic 0 and 2.6 V for logic 1. The non-inverting input circuit 300 includes a common gate switching section 306 that switches the Data In 302 to maximize a dynamic range for the available power supplies and a level shift section 308 that sets the proper voltage levels for Data Out 304.

Common gate switching section 306 includes a D-mode FET (FET1) configured as a load and a D-mode FET (FET2) configured as a common gate switch connected in series between a high supply voltage Vdd (e.g., 4V) and a low supply voltage Vee (e.g., ground potential). More specifically, the drain electrode of load FET1 is coupled to Vdd and its gate-source connection is coupled to the drain of common source FET2 at an intermediate output 310. The gate electrode of FET2 is connected to Vee1 (e.g., ground potential). Data In 302 is directed to the source electrode of common source FET2. The source electrode presents a low input impedance to the external digital controller, much lower than the impedance looking into the gate electrode. For this reason, driving the source electrode requires higher current levels and is not standard practice.

The gate-to-source voltages Vgs required to switch common gate FET2, and specifically the negative Vgs<0.9 V can be achieved without requiring an additional supply voltage at the gate electrode. For example, if Data In is 0.5 V, the Vgs=−0.5 V, which is insufficient to turn FET2 off so it remains in its normally on state. When Data In is a logic 1 (2-2.5 V), the Vgs is <−2 V and FET2 turns of.

As shown in FIG. 3B, when Data In is a logic 1, common gate FET2 turns off so no current flows through load FET1 causing an intermediate output voltage 312 at intermediate output 310 to be pulled up to Vdd (e.g., 4 V). When Data In is a logic 0, common gate FET2 turns on and pulls intermediate output voltage 312 down to near ground potential. As shown, a dynamic range 314 of the common source switching section approximates the rail-to-rail voltage range between the positive supply Vdd and ground potential. The output voltage 312 does not quite reach ground potential because at Data In logic 0 voltages in the range of 0 to 0.5 V the common gate FET2 is not fully on.

The switch point 316 is the point determined by the threshold Vgs (the point where FET2 stops conducting current). In this example, the switch point 316 is 0 V (ground potential)+Vgs threshold (−0.9 V) which is 0.9 V. Below 0.9 V (the range of Data In logic 0) FET2 remains on. The switch point 316 is decoupled from ground potential.

Referring again to FIG. 3A, level shift section 308 includes a D-mode FET (FET3) configured as a source follower, N series-connected diodes Dn and a D-mode FET (FET4) configured as a current source. The drain electrode of FET3 is coupled to the high supply Vdd. The gate electrode of FET3 is coupled to intermediate output 310 so that a voltage at the source of FET3 follows the intermediate output voltage 312. The N diodes Dn level shift this voltage down by N diode drops (e.g., N*0.6 V) to produce low and high output voltage levels 318 for Data Out 304 at the drain electrode of current source FET4. N can 0, 1 or multiple. In an alternate embodiment, the diodes Dn and FET4 could be replaced with a load resistor. Typically, the low output voltage level for an output logic 0 is driven to the low supply (e.g., ground potential). To accomplish this, the diode drop must exceed Vss. In this case, N=3 diodes are used to drive Data Out logic 0 to ground. This necessarily reduces the output voltage level for logic 1 by the same amount. As a result, as shown in FIG. 2C, a dynamic range 320 of input 300 is 2.6 V. For the same supply voltage Vdd, common gate input circuit 300 supports a higher dynamic range than the common source inverter.

The diodes in the III/V IC can be fabricated as standard p-n junction diodes or can be a D-mode FET configured as a diode.

An input level shifter can be positioned between Data In and the source electrode of the common gate FET2 to shift the switch point (without affecting the dynamic range of the common gate switching section) and to present a high input impedance to Data In to reduce the current requirements to drive the input circuit. For brevity, the description of the input circuit will not be repeated and like reference numbers will be used for the input circuit shown in FIG. 3A.

Figure 4A:
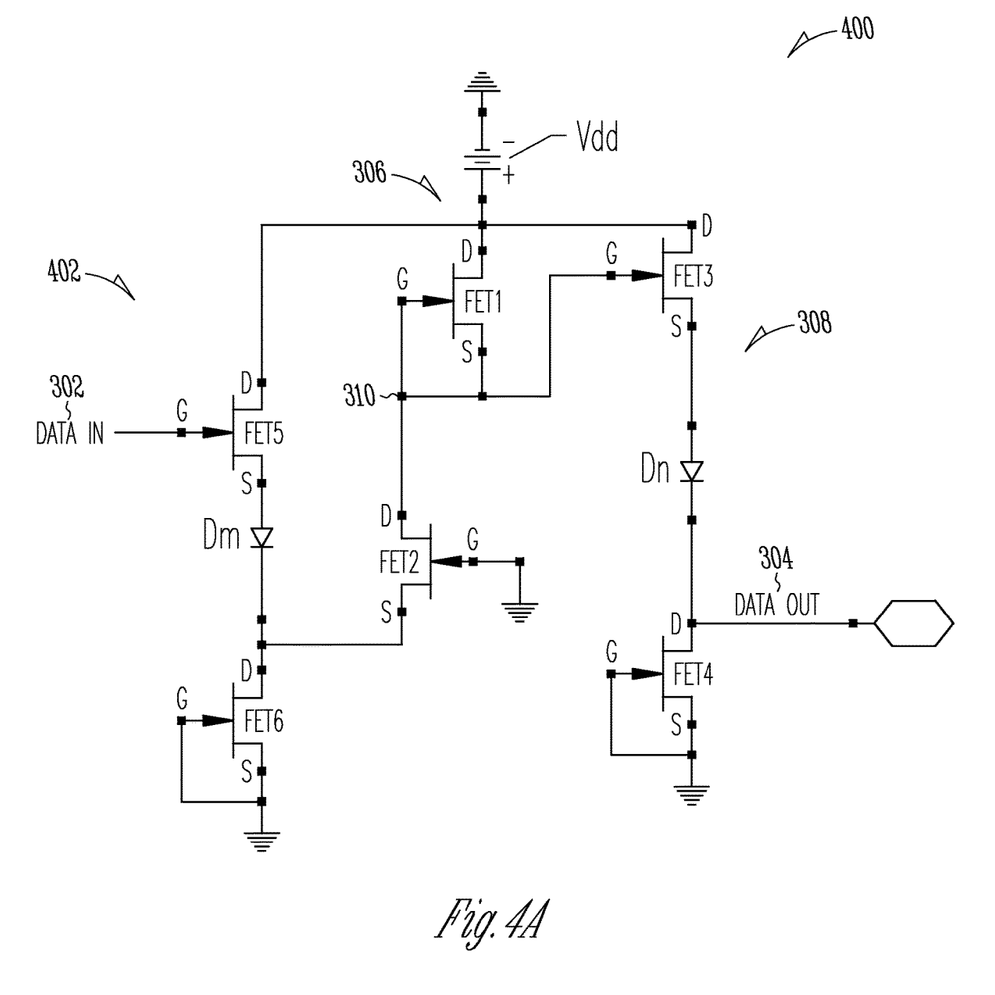
FIGS. 4A-4C illustrate a second embodiment of an input inverter including a common gate switching section whose source electrode is coupled through a high impedance input level shifter to the input logic signals and a source follower level shifter and the dynamic ranges of the switched voltages.
Figure 4B:
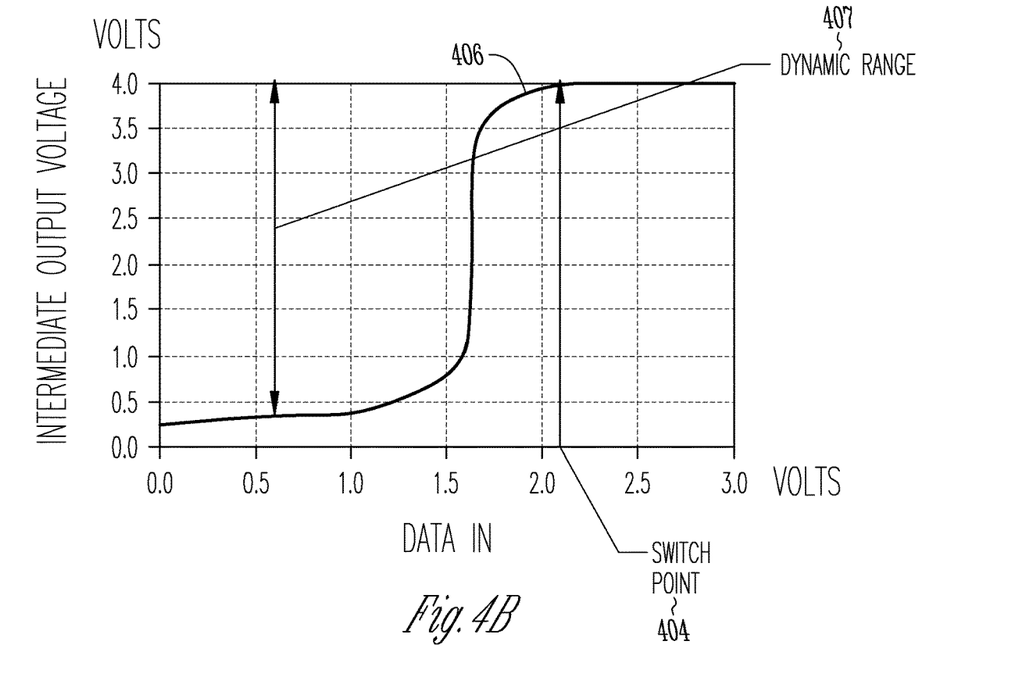
Figure 4C:
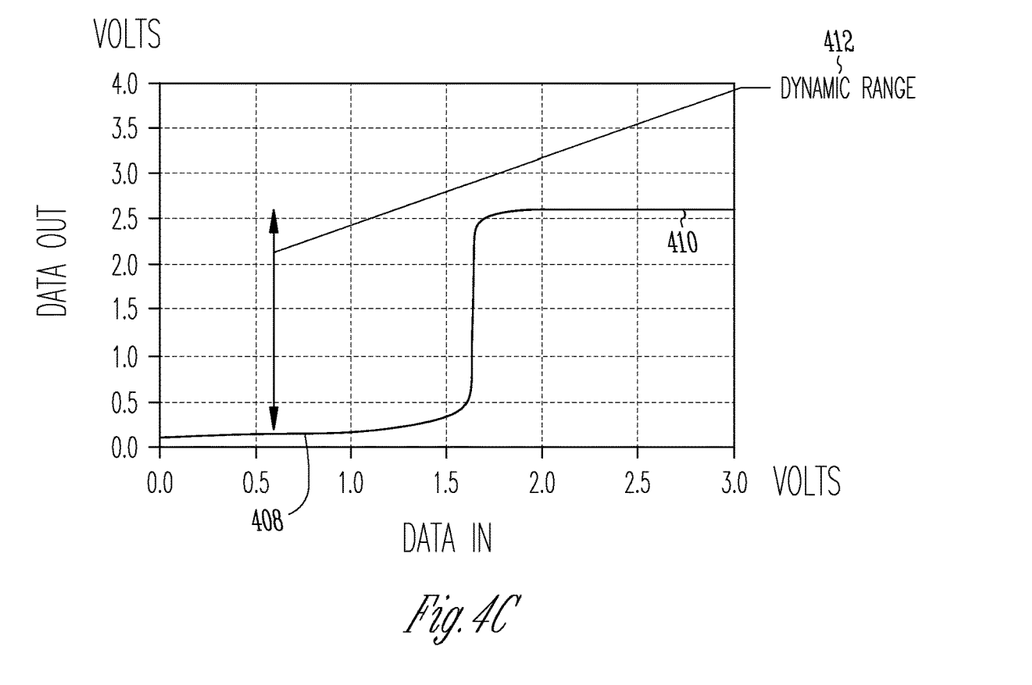

Referring now to FIGS. 4A-4C, in an embodiment an input circuit 400 includes an input level shifter 402 positioned between Data In 302 and the source electrode of common gate FET2 that shifts the switch point 404 from 0.9 V to 2.1 V and presents a high input impedance to Data In 302 (e.g., the external digital controller) to reduce the amount of current required to drive the input circuit. Input level shifter 402 is a source follower network that includes a D-mode FET (FET5) whose drain electrode is connected Vdd, a gate electrode driven by Data In, and a source electrode coupled to M series-connected diodes Dm (M can be 0, 1 or multiple), and a D-mode FET (FET6) connected as a current source to ground potential whose drain electrode is connected to the source electrode of common gate FET2. The impedance looking into the gate electrode of FET 5 presents a much higher than the impedance looking into the source electrode of FET2, to the Data In signal and the external digital controller. The source follower helps maintain signal and integrity and its output is able to drive the low impedance load created by the source of common gate FET2.

As shown in FIG. 4B, the M series connected diodes offset the switch point from the inherent Vgs of FET2 by M*Vdiode. In this case, M=2 and the switch point is 0.9 V+2*0.6 equals 2.1 V. A Data In logic 0 puts FET5 in a low current state where the out of the follower goes towards ground potential but does not reach ground potential due to incomplete cut-off of FET5. Voltage at source of FET2 is low and FET2 remains on pulling intermediate voltage 406 at the intermediate output 310 towards ground potential. Note, because the switch point 404 has been pushed out to 2.1 V, a Data In logic 0 in the 0 to 0.5V range has common gate FET2 turned on such that intermediate voltage 406 can be pulled closer to ground potential. A Data in logic 1 increases the FET5 current raising potential at the drain of current source FET6 and currently the voltage at the source electrode of common gate FET2 to turn FET2 off forcing intermediate voltage 406 to go to the high supply Vdd. The number M of diodes is selected from none to several to enhance the low logic conditions due to incomplete shut off of FET 5. A dynamic range 407 of the common gate switching section approximately spans the high supply Vdd to ground potential. As shown in FIG. 4C, output level shifter shifts the low and high voltages 408 and 410 for data out to approximately ground potential and about 2.6 V as before. The input level shifter affects the switch point and input impedance but does not impact the switching section's dynamic range 407 or the input circuit's dynamic range 412.

Figure 5A:
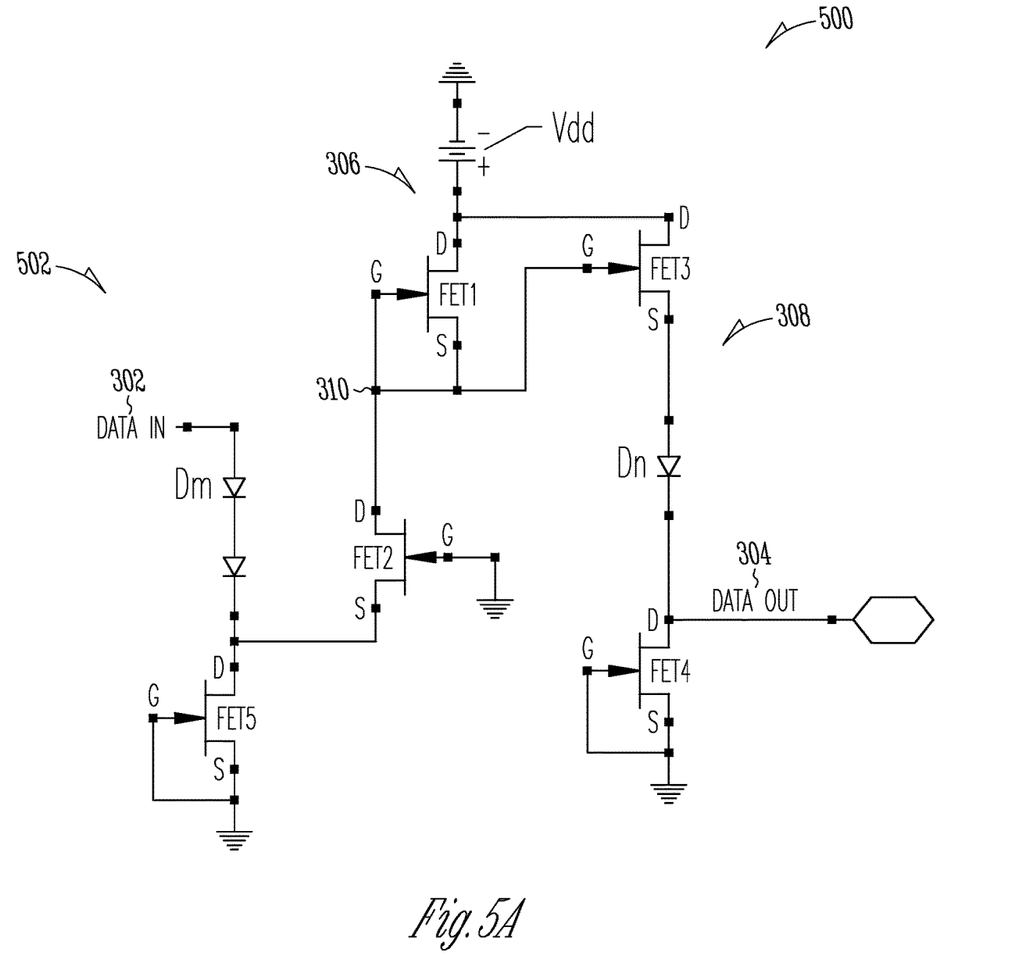
FIGS. 5A-5C illustrate a second embodiment of an input inverter including a common gate switching section whose source electrode is coupled through a high impedance input level shifter to the input logic signals and a source follower level shifter and the dynamic ranges of the switched voltages.
Figure 5B:
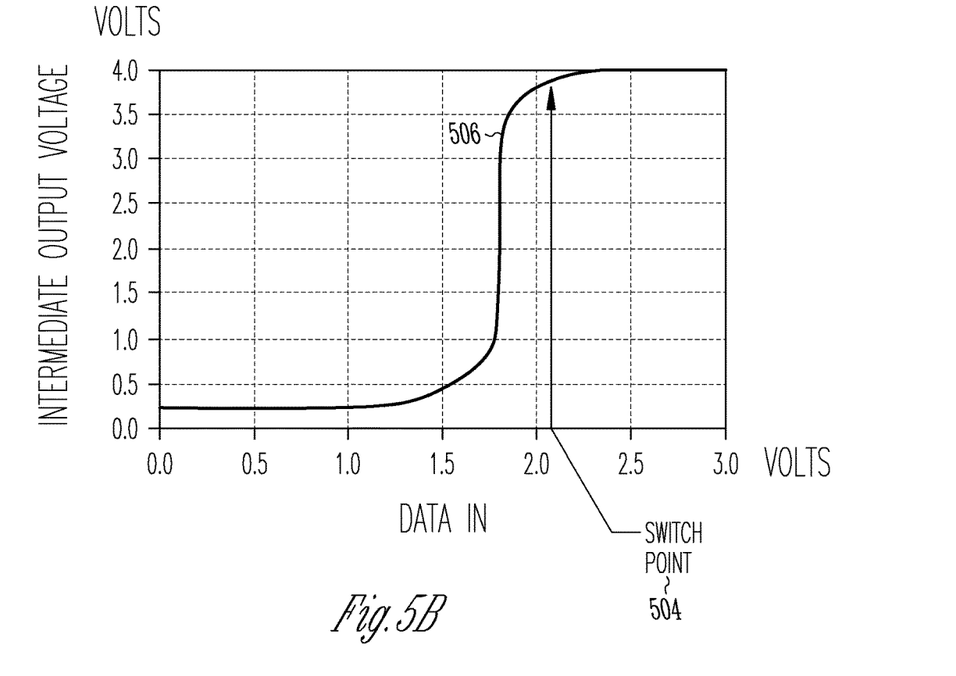
Figure 5C:
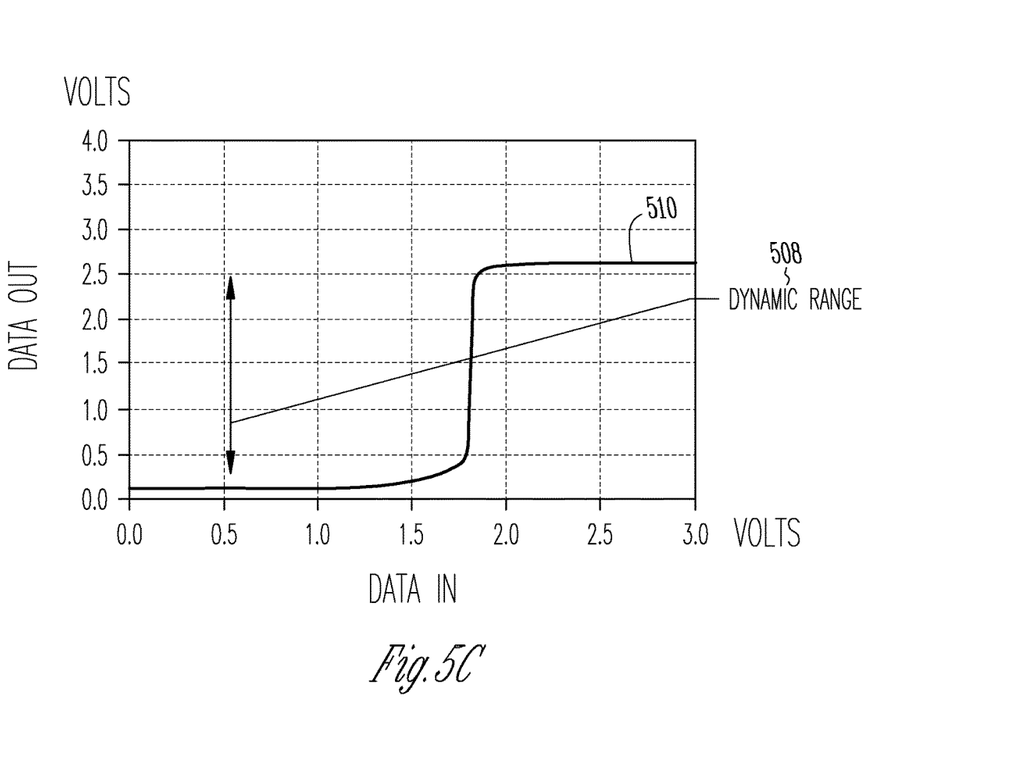

Referring now to FIGS. 5A-5C, in an embodiment an input circuit 500 includes an input level shifter 502 positioned between Data In 302 and the source electrode of common gate FET2 that shifts the switch point 504 from 0.9

V to 2.1 V. Input level shifter 502 includes M series-connected diodes Dm connected to Data In 302 in series with a D-mode FET (FET5) as a current source to ground potential whose drain electrode is connected to the source electrode of common gate FET2.

As shown in FIG. 4B, a Data In logic 0 turns the series-connected diodes Dm off such that FET5 operates in its linear or low resistance mode to hold the voltage at source of FET2 low. Common gate FET2 remains on pulling intermediate voltage 506 at the intermediate output 310 towards ground potential. A Data in logic 1 turns the series-connected diodes on saturating FET5, which increases the voltage at the source electrode of common gate FET2 turning FET2 off and forcing intermediate voltage 506 to go to the high supply Vdd. This configuration of the input level shifter presents a lower input impedance during a logic high state but is more effective at reaching a logic low because the diodes are shut off. The M series connected diodes offset the switch point from the inherent Vgs of FET2 by M*Vdiode. In this case, M=2 and the switch point is 0.9 V+2*0.6 equals 2.1 V. As shown in FIG. 5C, output level shifter shifts the low and high voltages 508 and 510 for data out to approximately ground potential and about 2.6 V as before.

Other configurations of an input level shifter to offset the switch point and/or increase the input impedance to the input circuit are contemplated within the scope of the present invention.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A III/V Integrated Circuit (IC), comprising:
   depletion-mode (D-mode) Field Effect Transistors (FETs) formed in a substrate composed of a III/V semiconductor material;
   an input circuit having an input configured to receive digital logic signals 0 and 1 as low and high input voltages, respectively, for a first technology, said input circuit comprising
   a common gate switching section including a first D-mode FET (FET1) configured as a load and a second D-mode FET (FET2) configured as a common gate switch connected in series between a high supply (Vdd) and a low supply (Vee1), said common gate switch responsive to low and high input voltages on opposite sides of a switch point to remain on and turn off, respectively, to switch an intermediate voltage over a dynamic range that spans the high supply (Vdd) to the low supply (Vee1), wherein the second D-mode FET (FET2) has a drain electrode coupled to a gate-source connection of the first D-mode FET (FET1) at an intermediate output at which the intermediate voltage is switched, a gate electrode coupled to the low supply (Vee1) and a source electrode coupled to the input circuit input; and
   an output level-shifter including a third D-mode FET (FET3) configured as a source follower and a load configured to shift the intermediate voltage down to low and high output voltages compatible with switching D-mode FETs at a circuit output, and
   one or more buffered FET digital logic circuits coupled to the circuit output, each said logic circuit comprised of a configuration of D-mode FETs responsive to digital logic signals 0 and 1 at the output low and high output voltages.

2. The III/V IC of claim 1, wherein the first technology is a Silicon CMOS technology.

3. The III/V IC of claim 1, wherein the III/V semiconductor material is selected from one of GaAs, GaN and IP.

4. The III/V IC of claim 1, wherein the III/V IC is a Monolithic Microwave IC (MMIC) and the one or more buffered FET digital logic circuits include one or more of a digital attenuator, a digital phase shifter, an RF amplifier and an RF switch.

5. The III/V IC of claim 1, wherein the load comprises N series-connected diodes where N is an integer of zero, one or more and a fourth D-mode FET (FET4) configured as a current source.

6. The III/V IC of claim 1, wherein the low supply (Vee1) is at ground potential or lower.

7. The III/V IC of claim 1, wherein the source electrode of the second D-mode FET (FET2) is directly connected to the input, wherein the switch point is the voltage at the source electrode of the second D-mode FET (FET2) at which a negative gate-to-source voltage (Vgs) required to turn the second D-mode FET (FET2) off is reached.

8. The III/V IC of claim 1, wherein a nominal switch point is the voltage at the source electrode of the second D-mode FET (FET2) at which a negative gate-to-source voltage (Vgs) required to turn the second D-mode FET (FET2) off is reached, further comprising:
   an input level shifter between the input and the source electrode of the second D-mode FET (FET2) configured to shift the nominal switch point by a positive offset.

9. The III/V IC of claim 8, wherein the input level shifter is configured to present a higher input impedance to the input than an impedance looking into the source electrode of the second D-mode FET (FET2).

10. The III/V IC of claim 8, wherein the input and output level shifters are independent.

11. The III/V IC of claim 8, wherein the shifted switch point is greater than a downward level shift of the output level shifter.

12. The III/V IC of claim 8, wherein the input level shifter comprises a fifth D-mode FET (FET5) configured as a source follower whose gate electrode is coupled to the input, drain electrode is coupled to the high supply (Vdd) and source electrode is connected through M series-connected diodes where M is an integer of zero, one or more to a sixth D-mode FET (FET6) configured as a current source, wherein the gate electrode of the fifth D-mode FET (FET5) presents a high input impedance to the data logic signals, wherein said positive offset is a voltage drop across the M series-connected diodes.

13. The III/V IC of claim 8, wherein the input level shifter comprises M series-connected diodes where M is an integer of one or more between the input and a sixth D-mode FET (FET6) configured as a current source, wherein responsive to a digital logic signal 0 the M series-connected diodes are turned off and conduct no current to present a high input impedance, wherein responsive to a digital logic signal 1 the M series-connected diodes are turned on and conduct current thereby reducing the high input impedance, wherein said positive offset is a voltage drop across the M series-connected diodes.

14. A III/V Integrated Circuit (IC), comprising:
depletion-mode (D-mode) Field Effect Transistors (FETs) formed in a substrate composed of a III/V semiconductor material selected from GaAs, GaN and InP;
an input circuit having an input configured to receive digital signals 0 and 1 as low and high input voltages, respectively, compatible with Si CMOS technology, said input circuit comprising
a common gate switching section including a first D-mode FET (FET1) configured as a load coupled to a high supply voltage (Vdd), a second D-mode FET (FET2) configured as a common gate switch having a drain electrode coupled to a gate-source connection of the load at an intermediate output, a gate electrode coupled to ground potential and a source electrode coupled to the input circuit input, said common gate switch responsive to low and high input voltages on opposite sides of a switch point to remain on and turn off, respectively, to switch an intermediate voltage over a dynamic range that spans a high supply (Vdd) to ground potential; and
an output level-shifter including a third D-mode FET (FET3) configured as a source follower and a load configured to shift the intermediate voltage down to low and high output voltages compatible with switching D-mode FETs at a circuit output, and
one or more buffered FET digital logic circuits coupled to the circuit output, each said logic circuit comprised of a configuration of D-mode FETs responsive to digital logic signals 0 and 1 at the output low and high output voltages.

15. The II/V IC of claim 14, wherein a nominal switch point is the voltage at the source electrode of the second D-mode FET (FET2) at which a negative gate-to-source voltage (Vgs) is required to turn the second D-mode FET (FET2) off is reached, further comprising:
an input level shifter between the input and a source of the second D-mode FET (FET2) configured to shift the nominal switch point by a positive offset.

16. A III/V Integrated Circuit (IC), comprising:
depletion-mode (D-mode) Field Effect Transistors (FETs) formed in a substrate composed of a III/V semiconductor material;
an input configured to receive digital signals 0 and 1 as low and high input voltages, respectively, for a first technology; and
a common gate switching section including a first D-mode FET (FET1) configured as a load and a second D-mode FET (FET2) configured as a common gate switch connected in series between a high supply (Vdd) and a low supply (Vee1), a source electrode of said common gate switch responsive to low and high input voltages on opposite sides of a switch point to remain on and turn off, respectively, to switch an intermediate voltage over a dynamic range that spans the high supply (Vdd) to the low supply (Vee1), wherein the second D-mode FET (FET2) has a drain coupled to a gate-source connection of the first D-mode FET (FET1) at an intermediate output at which the intermediate voltage is switched, a gate electrode coupled to the low supply (Vee1) and the source electrode coupled to the input circuit input.

17. The III/V IC of claim 16, wherein a nominal switch point is the voltage at the source electrode of the second D-mode FET (FET2) at which a negative gate-to-source voltage (Vgs) required to turn FET2 off is reached, further comprising:
an input level shifter between the input and the source of the second D-mode FET (FET2) configured to shift the nominal switch point by a positive offset.

18. The III/V IC of claim 17, wherein the input level shifter presents a higher input impedance to the input than an impedance looking into the source electrode of the second D-mode FET (FET2).

* * * * *

UNITED STATES PATENT AND TRADEMARK OFFICE
CERTIFICATE OF CORRECTION

PATENT NO. : 12,028,059 B2
APPLICATION NO. : 17/655356
DATED : July 2, 2024
INVENTOR(S) : John P. Bettencourt

Page 1 of 1

It is certified that error appears in the above-identified patent and that said Letters Patent is hereby corrected as shown below:

In the Claims

In Column 8, Line 7, in Claim 3, delete "GaN and IP." and insert --GaN, and InP.-- therefor Signed and Sealed this
Eleventh Day of March, 2025

Coke Morgan Stewart
*Acting Director of the United States Patent and Trademark Office*